United States Patent
Ouyang (10) Patent No.: US 7,295,435 B2
(45) Date of Patent: Nov. 13, 2007

(54) HEAT SINK HAVING FERROFLUID-BASED PUMP FOR NANOLIQUID COOLING

(75) Inventor: Chien Ouyang, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 131 days.

(21) Appl. No.: 11/225,356

(22) Filed: Sep. 13, 2005

(65) Prior Publication Data

US 2007/0058340 A1    Mar. 15, 2007

(51) Int. Cl.
*H05K 7/20* (2006.01)
(52) U.S. Cl. ............... 361/699; 361/689; 361/704; 361/718; 174/15.1; 174/15.2
(58) Field of Classification Search ............... 361/679, 361/683, 688, 689, 698, 699, 701–704, 707–709, 361/712, 718; 174/15.1, 15.2; 165/80.2, 165/80.3, 80.4, 104.17–104.22, 104.28, 104.33, 165/185, 905; 257/714; 62/3.1, 3.3, 3.7
See application file for complete search history.

(56) References Cited

U.S. PATENT DOCUMENTS

| 5,355,942 | A | | 10/1994 | Conte |
| 5,444,983 | A | * | 8/1995 | Howard ..................... 62/3.1 |
| 6,695,974 | B2 | * | 2/2004 | Withers et al. ............... 252/70 |
| 7,104,313 | B2 | * | 9/2006 | Pokharna et al. .......... 165/80.4 |
| 2004/0182099 | A1 | * | 9/2004 | Hsu ......................... 62/259.2 |
| 2005/0139345 | A1 | * | 6/2005 | Pokharna et al. .......... 165/80.4 |
| 2005/0160752 | A1 | * | 7/2005 | Ghoshal et al. ............ 62/259.2 |
| 2006/0090474 | A1 | * | 5/2006 | Sauciuc et al. ............... 62/3.2 |
| 2006/0289987 | A1 | * | 12/2006 | Chiu .......................... 257/714 |

OTHER PUBLICATIONS

High Performance Liquid Metal Cooling Loops Authors: U. Ghoshal, D. Grimm, S. Ibrani, C. Johnston, and A. Miner nanoCoolers, Inc. as published in the 21st IEEE Semi-Therm Symposium Sep. 2005; 4 pages.
Free Surface Heat Transfer and Innovative Designs for Thin and Thick Liquid Walls Authors: A. Y. Ying, N. Morley, S. Smolentsev, K. Gulec, and P. Fogarty Mechanical & Aerospace Engineering Department UCLA, Los Angeles, CA 90095 Draft copy submitted to ISFNT-5; Rome Sep. 1999; pp. 1-8.

* cited by examiner

*Primary Examiner*—Lisa Lea-Edmonds
*Assistant Examiner*—Anthony M Haughton
(74) *Attorney, Agent, or Firm*—Osha Liang LLP (57) ABSTRACT

A heat sink uses a ferrofluid-based pump assembly for controlling the direction of nanofluid flow within the heat sink. The nanofluid is thermally conductive and absorbs heat from a heat source, which is then directed away from the heat source by the ferrofluid-based pump assembly. The ferrofluid-based pump assembly uses a motor to rotate at least one magnet so as to rotate ferrofluid contained in the ferrofluid-based pump assembly. The direction of nanofluid flow within the heat sink is dependent on the movement of ferrofluid in the ferrofluid-based pump assembly.

18 Claims, 9 Drawing Sheets

HEAT SINK HAVING FERROFLUID-BASED PUMP FOR NANOLIQUID COOLING

BACKGROUND

Figure 1:
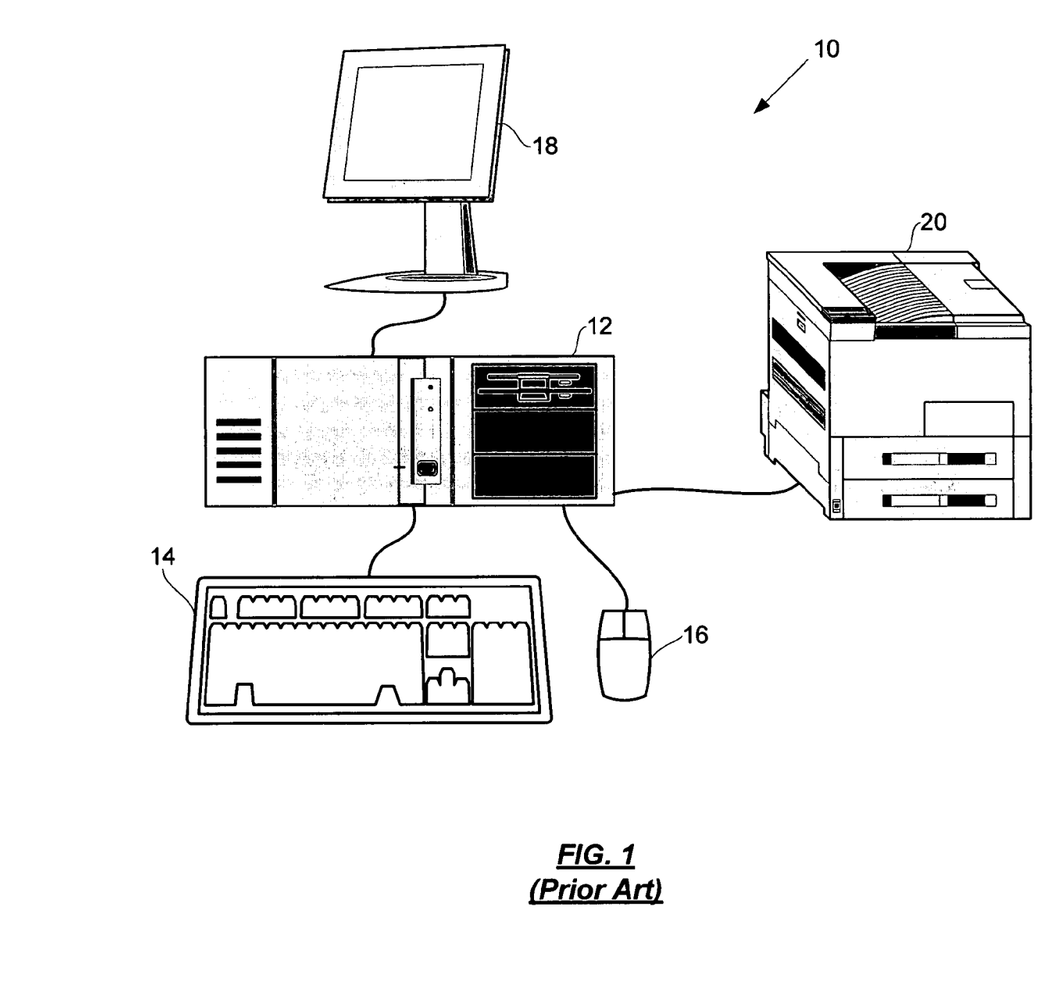
FIG. 1 shows a computer system.

A computer system 10, as shown in FIG. 1, includes several components that are collectively used by a user to perform various functions such as, for example, preparing and generating a document with a word processor application. With the computer system 10, the user may input data to a computing portion 12 using peripheral devices such as a keyboard 14 or a mouse 16. Data may also be provided to the computing portion 12 using data storage media (e.g., a floppy disk or a CD-ROM (not shown)). The computing portion 12, using memory and other internal components, processes both internal data and data provided to the computing portion 12 by the user to generate data requested by the user. The generated data may be provided to the user via, for example, a display device 18 or a printer 20. The computing portion 12 of a computer system typically includes various components such as, for example, a power supply, disk drives, and the electrical circuitry required to perform the necessary and requested operations of the computer system.

Figure 2:
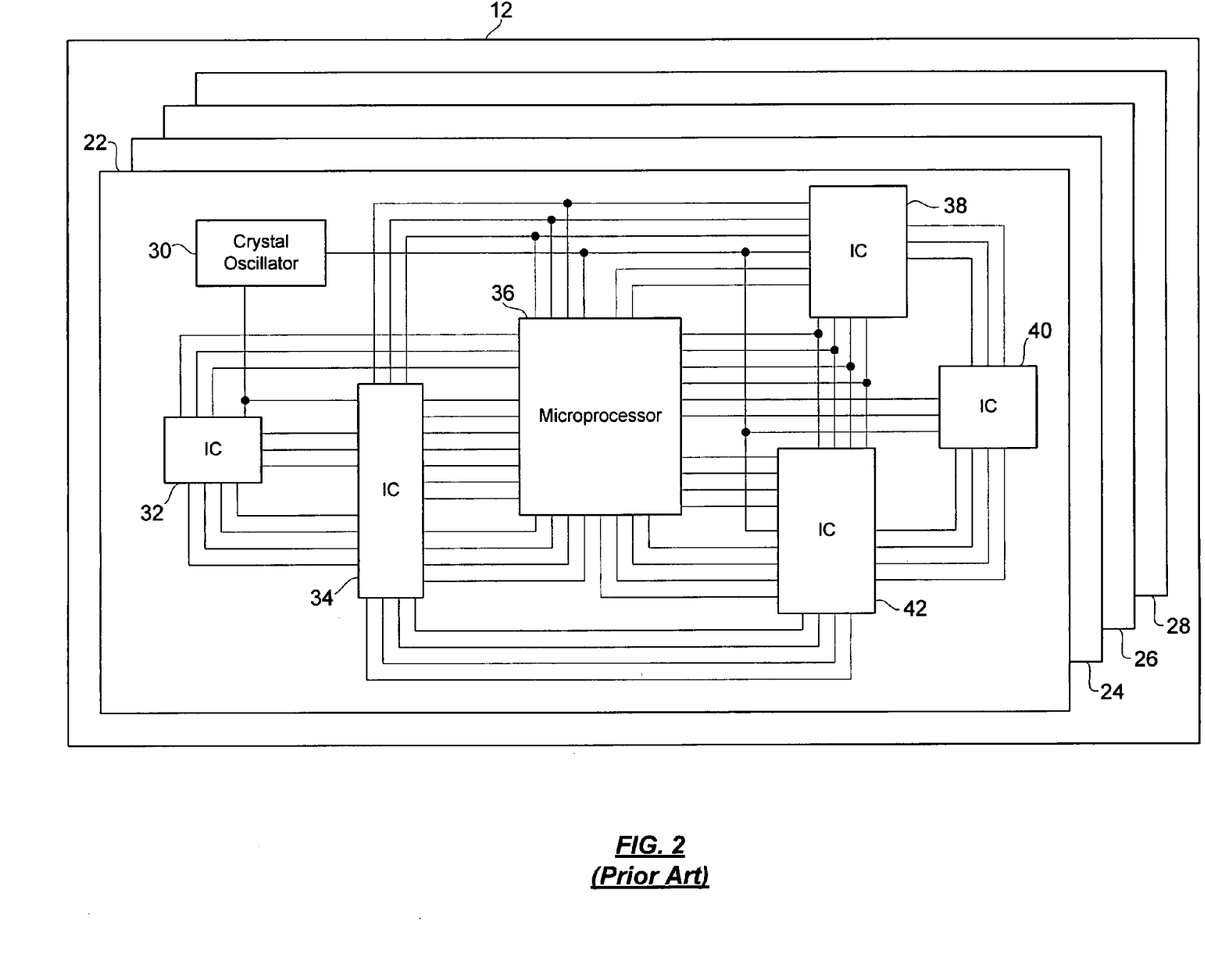
FIG. 2 shows a portion of a computer system.

As shown in FIG. 2, the computing portion 12 may contain a plurality of circuit boards 22, 24, 26, 28 (e.g., printed circuit boards (PCBs) or printed wiring boards (PWBs)) on which various circuit components are implemented. For example, a computing portion designed to have enhanced sound reproducing capabilities may have a circuit board dedicated to implementing circuitry that specifically operate to process data associated with the reproduction of sound.

In FIG. 2, the components of exemplary circuit board 22 are shown. A crystal oscillator 30 provides a reference of time to various integrated circuits (ICs) 32, 34, 36, 38, 40, 42 (e.g., application specific integrated circuits (ASICs), field-programmable gate arrays (FPGAs), microprocessors, logic gates) that are connected to the circuit board 22. The integrated circuits 32, 34, 36, 38, 40, 42 communicate with one another, i.e., pass data, using wires or traces of conductive material (e.g., copper (shown, but not labeled)) embedded in the circuit board 22.

In operation, an integrated circuit, such as those shown in FIG. 2, dissipates heat as a result of work performed by the integrated circuit. Energy that is needed by the integrated circuit for work is not consumed with 100% efficiency, thereby resulting in excess energy that is released, among other things, as heat. As integrated circuits become more dense (i.e., more transistors per unit area) and faster (i.e., higher operating frequencies), they generate more heat. As excessive heat is damaging to an integrated circuit both in terms of performance and component integrity, an important design consideration involves ensuring that heat dissipated by an integrated circuit is sufficiently drawn away from the integrated circuit, where the efficiency of drawing away heat from the integrated circuit is expressed in terms of what is referred to as the "heat transfer rate."

Figure 3:
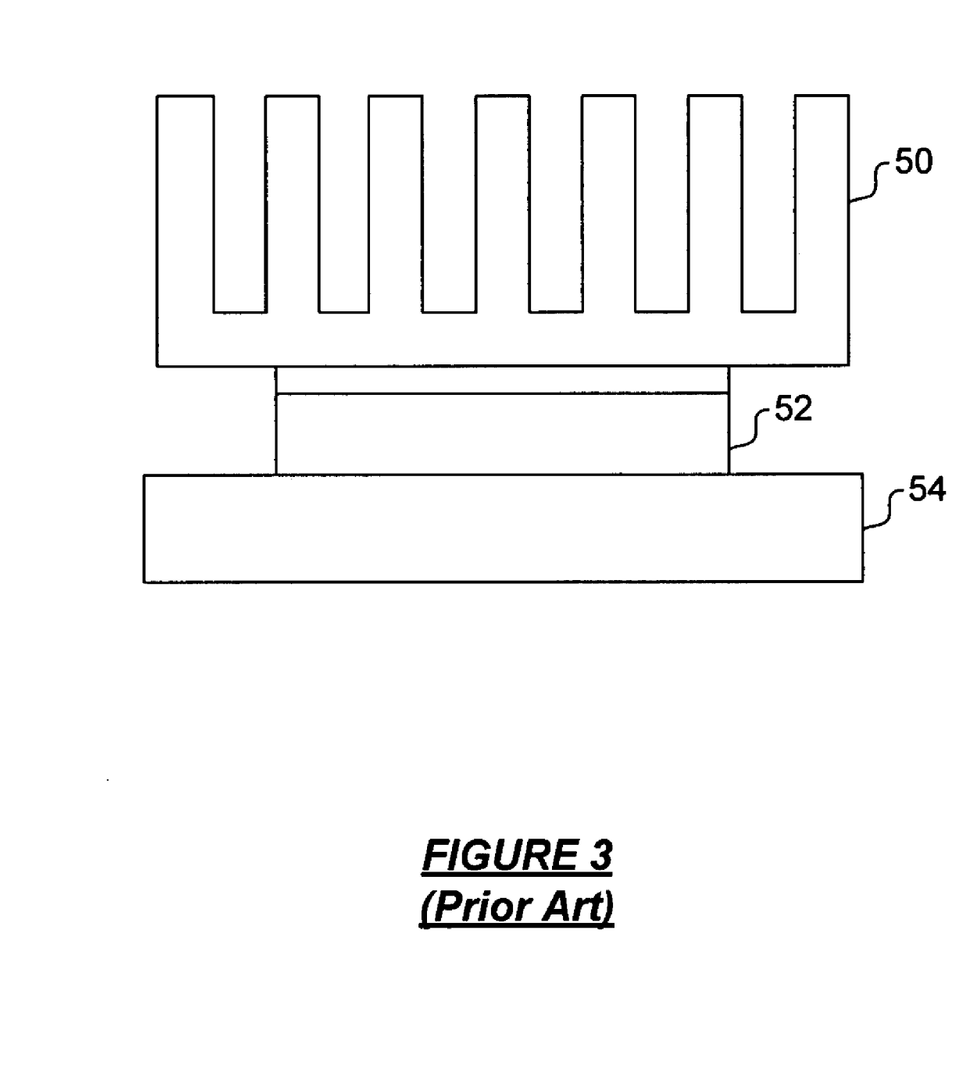
FIG. 3 shows a heat sink as used with an integrated circuit.

"Heat sinks" are devices that are commonly used to cool integrated circuits. FIG. 3 shows a heat sink 50 as used with an integrated circuit 52 housed in a package 54 atop a substrate 56. The heat sink 50 is made of a high thermal conductivity metal (e.g., copper or aluminum). A "high thermal conductivity metal" is one that allows heat to pass through it because it contains many free electrons.

A base of the heat sink 50 is secured over the integrated circuit 52 by, for example, a retention clip (not shown) or an adhesive or thermal interface material (shown, but not labeled). During operation of the integrated circuit 52, the temperature of the integrated circuit 52 increases due to increased particle movement resulting from a build-up of excess energy. The increased integrated circuit temperature results in an increase in the temperature of the package 54, and consequently, of the heat sink 50. The increased temperature of the heat sink 50 results in an increase in the temperature of the air around the heat sink 50, whereby the heated air rises and effectively draws heat away from the integrated circuit 52. This process is referred to as "convection."

The removal of heat dissipated from an integrated circuit by a heat sink is dependent on numerous factors. For example, the thermal resistance of the package that houses the integrated circuit affects how much heat transfers from the integrated circuit to the heat sink. Also, the effectiveness of the adhesives between the integrated circuit and its package and the package and the heat sink affects how much heat transfers between these components. Moreover, the conductivity of the materials used in the package and the heat sink has a direct bearing on the amount of heat that is transferred away from the integrated circuit. The surface area of the heat sink is also important as more surface area results in more air being heated, thereby resulting in more heat being drawn away from the integrated circuit by the rising heated air.

SUMMARY

According to one aspect of one or more embodiments of the present invention, a computer system comprises an integrated circuit and a heat sink operatively connected to the integrated circuit, where the heat sink comprises: a pipe arranged to carry nanofluid within the heat sink, and a pump assembly having ferrofluid and operatively connected to the pipe, where a direction of flow of the nanofluid in the heat sink is dependent on the ferrofluid.

According to another aspect of one or more embodiments of the present invention, a method of cooling an integrated circuit with a heat sink comprises: rotating ferrofluid within a pump assembly of the heat sink; propagating thermally conductive nanofluid toward the integrated circuit in a direction dependent on the rotating; and propagating the nanofluid away from the integrated circuit in a direction dependent on the rotating.

According to another aspect of one or more embodiments of the present invention, a heat sink comprises: a heat spreader through which air is arranged to flow; a copper pipe operatively connected to the heat spreader and arranged to carry thermally conductive nanofluid in the heat sink; and a motorized pump assembly arranged to rotate ferrofluid contained in the motorized pump assembly, where a direction of nanofluid flow in the heat sink is dependent on the rotation of the ferrofluid.

Other aspects and advantages of the invention will be apparent from the following description and the appended claims.

DETAILED DESCRIPTION

Embodiments of the present invention relate to a heat sink that "cools" an integrated circuit using thermally conductive fluid that carries heat away from the integrated circuit. Particularly, one or more embodiments of the present invention use a ferrofluid-based pump assembly that propagates nanofluid away from and towards an integrated circuit.

Figure 4A:
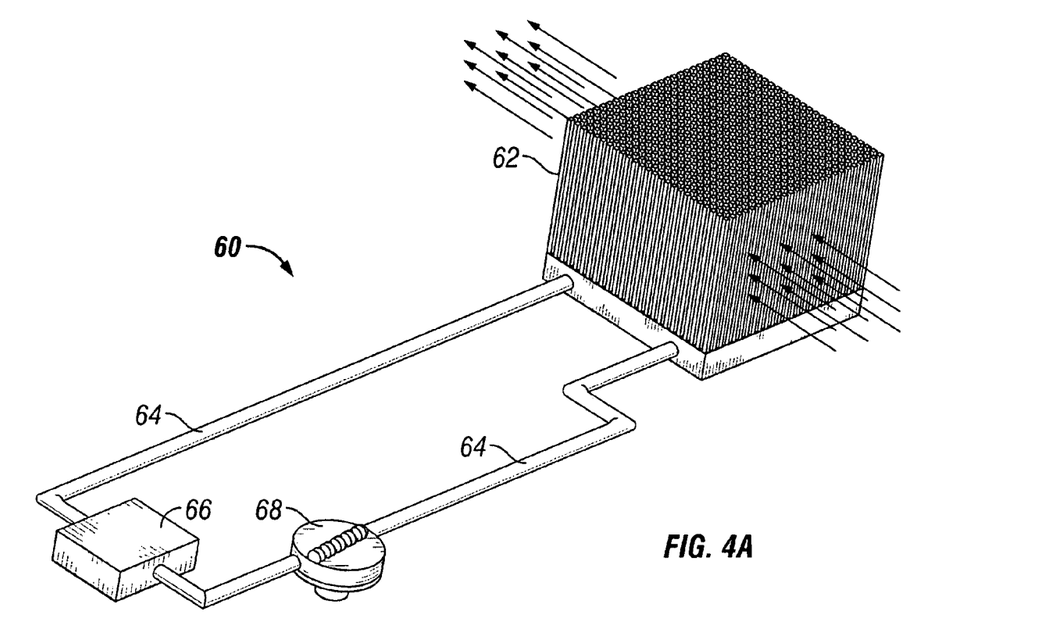
FIG. 4A shows a top-side view of a heat sink in accordance with an embodiment of the present invention.
Figure 4B:
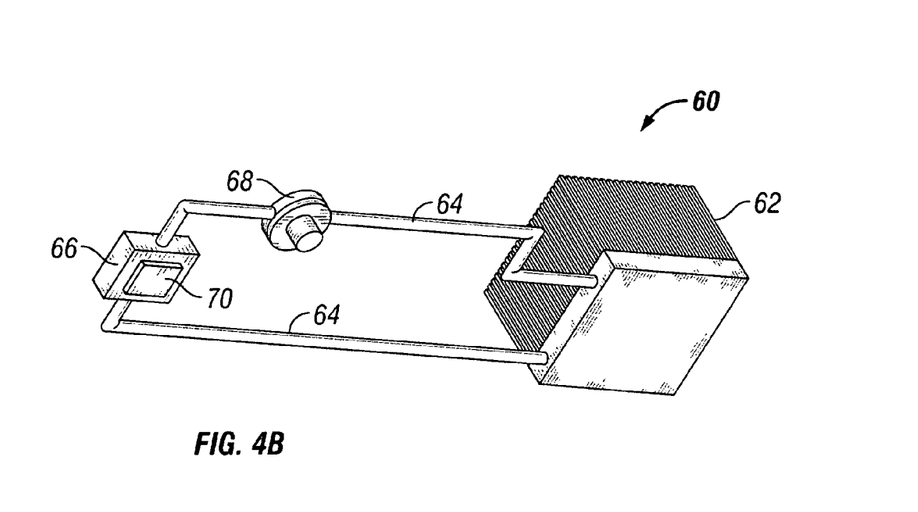
FIG. 4B shows a bottom-side view of a heat sink in accordance with an embodiment of the present invention.

FIGS. 4A and 4B shows respective top-side and bottom-side views of a heat sink 60 in accordance with an embodiment of the present invention. The heat sink 60 is formed of a heat spreader 62, a pipe 64, a heat source attachment portion 66, and a ferrofluid-based pump assembly 68. In one or more embodiments of the present invention, at least portions of any one of the heat spreader 62, the pipe 64, and the heat source attachment portion 66 may be formed of a thermally conductive metal such as, for example, copper.

The heat sink 60 is arranged to propagate nanofluid away from and toward a heat source 70 such as, for example, an integrated circuit. A "nanofluid" is a fluid that has dispersed within it solid particles that have diameters on the order of nanometers (1 nanometer=1 billionth of a meter=$1 \times 10^{-9}$ meters). In one or more embodiments of the present invention, nanofluid is formed of a thermally conductive fluid having solid particles that are also thermally conductive. Those skilled in the art will note that solid particles in a nanofluid may have higher thermal conductivity than the fluid itself. Further, the small size of thermally conductive solid particles in fluid results in increased surface area for thermal conduction relative to that provided with larger fluid-suspended particles.

In one or more embodiments of the present invention, nanofluid may be formed of copper nanoparticles produced, for example, by the evaporation of ethylene glycol.

Nanofluid carried away from the integrated circuit 70 by pipe 64 to the heat spreader 62 is "cooled" (i.e., removed of some amount of heat) by air flowing through the heat spreader 62 (exemplary direction of air flow indicated by arrows). Nanofluid "cooled" by the heat spreader 62 is then carried back toward the integrated circuit 70 by pipe 64 for further conduction of heat dissipated by the integrated circuit 70. In one or more embodiments of the present invention, the flow of air through the heat spreader 62 may be controlled with, for example, fans or vents (not shown). Further, in one or more embodiments of the present invention, the temperature of air flowing toward the heat spreader 62 may be controlled.

Figure 5A:
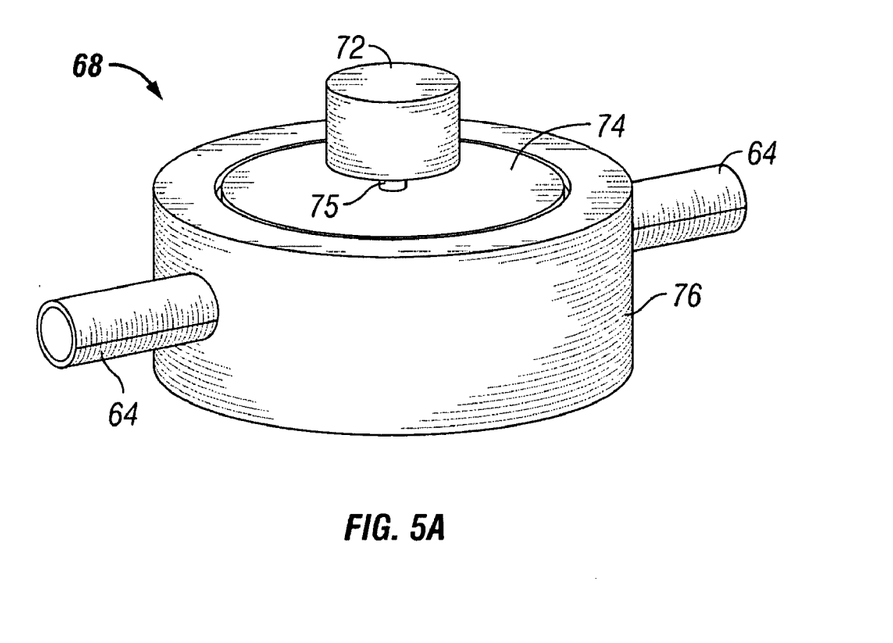
FIG. 5A shows a portion of a heat sink in accordance with an embodiment of the present invention.
Figure 5B:
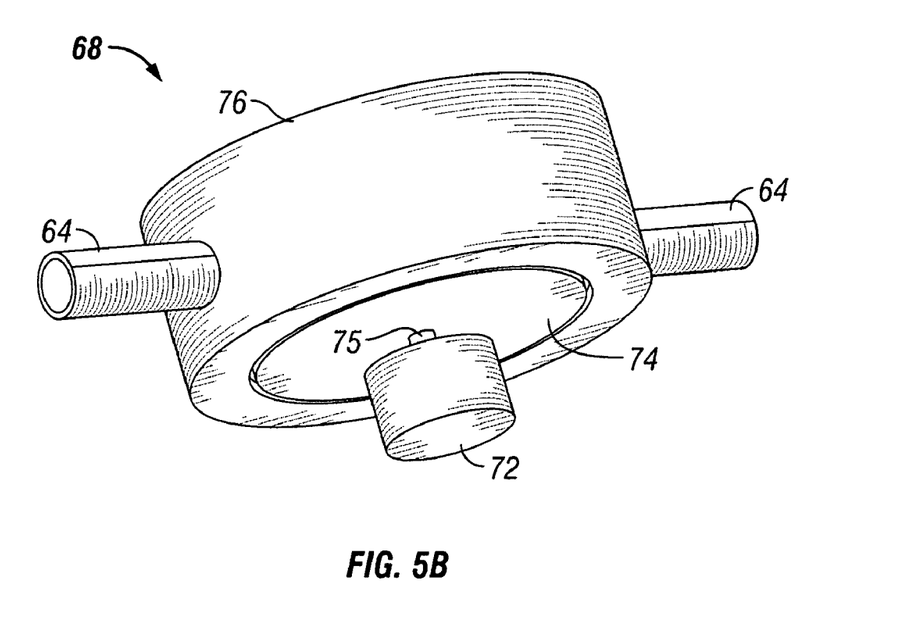
FIG. 5B shows a portion of a heat sink in accordance with an embodiment of the present invention.

The flow of nanofluid within the heat sink 60 is controlled by the ferrofluid-based pump assembly 68. FIGS. 5A and 5B shows an exemplary ferrofluid-based pump assembly 68 in accordance with an embodiment of the present invention. A "ferrofluid" is a fluid that has dispersed within it magnetic nanoparticles. These magnetic nanoparticles respond to a magnetic field.

Still referring to FIGS. 5A and 5B, the ferrofluid-based pump assembly 68 is formed of a motor 72 that is connected by a shaft 75 to a circular plate 74 to which a plurality of magnets (not shown) are attached. A metal piece 76 houses the ferrofluid-based pump assembly 68 to, for example, shield a magnetic field generated within the ferrofluid-based pump assembly 68. In one or more embodiments of the present invention, one or more of the circular plate 74 and the metal piece 76 may be formed of a ferromagnetic such as, for example, iron, nickel, or cobalt. Further, as shown in FIGS. 5A and 5B, the pipe 64 is connected to opposing sides of the ferrofluid-based pump assembly 68. However, in one or more other embodiments of the present invention, the pipe 64 does not have to necessarily be connected to opposing sides of the ferrofluid-based pump assembly 68.

In one or more other embodiments of the present invention, the metal piece 76 may be formed of a plurality of metal pieces 76. Moreover, those skilled in the art will note that the shape and relative size of the motor 72, the circular plate 74, and the metal piece 76 may differ than that shown in FIGS. 5A and 5B.

Figure 6:
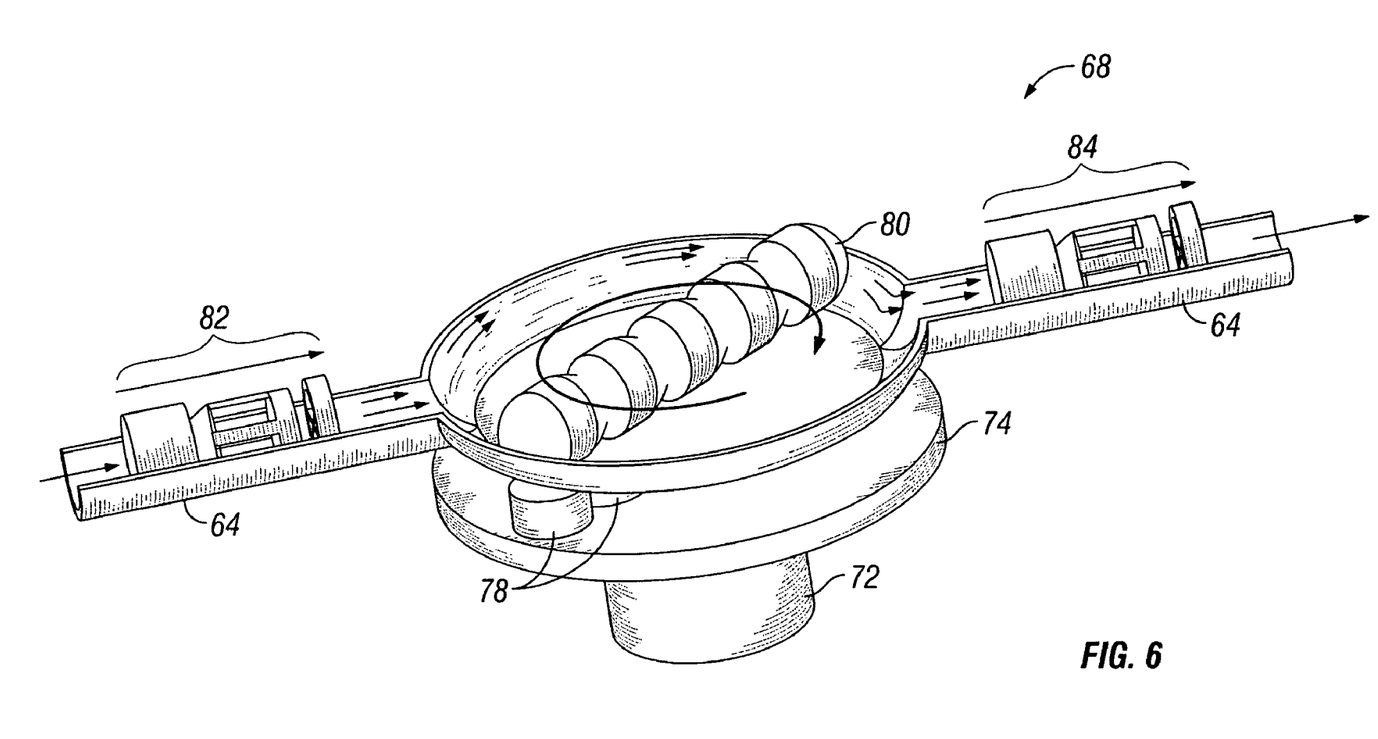
FIG. 6 shows a portion of a heat sink in accordance with an embodiment of the present invention.

FIG. 6 shows a portion of an exemplary ferrofluid-based pump assembly 68 in accordance with an embodiment of the present invention. Particularly, the ferrofluid-based pump assembly 68 is shown without the metal piece 76 shown in FIGS. 5A and 5B. In FIG. 6, the motor 72 rotates the circular plate 74, which, in turn, causes magnets 78 attached to the circular plate 74 to also rotate. The rotation of magnets 78 causes ferrofluid 80 to rotate in response to the magnetic field induced by the magnets 78. As shown in FIG. 6, the magnets 78 and ferrofluid 80 rotate in a clockwise direction. However, in one or more other embodiments of the present invention, the motor 72 may cause the magnets 78 and ferrofluid 80 to rotate in a counter-clockwise direction.

Figure 7:
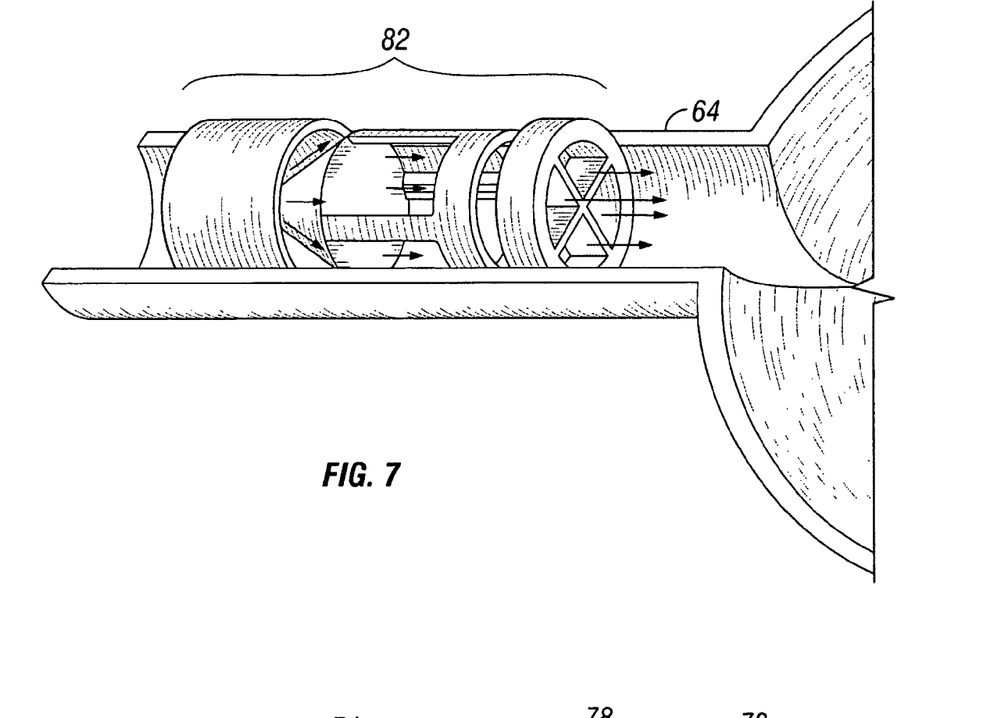
FIG. 7 shows a portion of a heat sink in accordance with an embodiment of the present invention.

The rotation of ferrofluid 80 drives nanofluid to flow as indicated by the arrows shown in FIG. 6. Further, the presence of optional check valves 82, 84 ensures that nanofluid flows in one direction to and from the ferrofluid-based pump assembly 68 (as indicated by the arrows shown in FIG. 7, check valve 82 ensures that nanofluid flows in one direction only).

Figure 8:
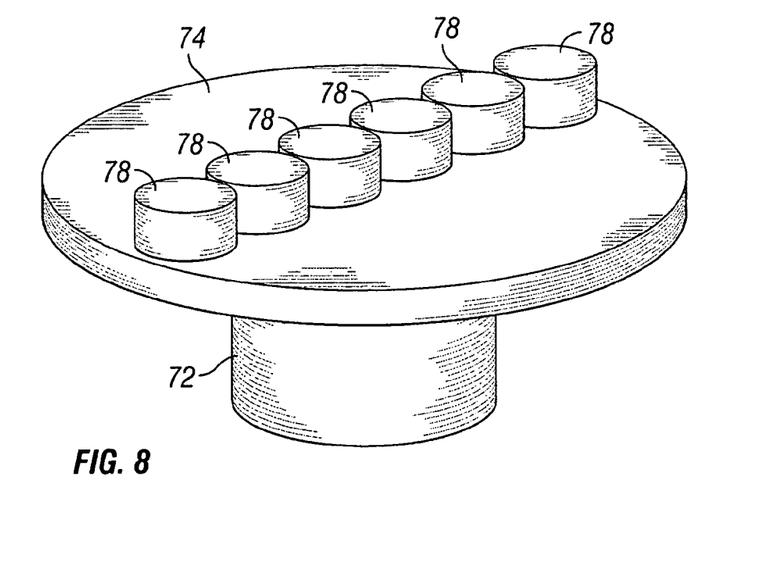
FIG. 8 shows a portion of a heat sink in accordance with an embodiment of the present invention.
Figure 9:
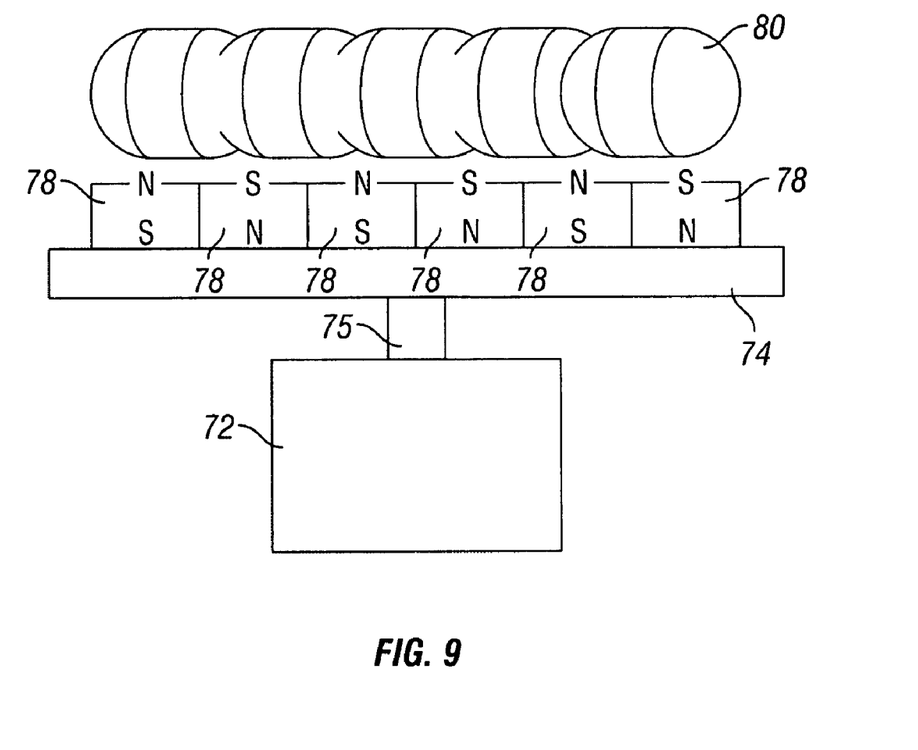
FIG. 9 shows a portion of a heat sink in accordance with an embodiment of the present invention.

FIGS. 8 and 9 show a portion of an exemplary ferrofluid-based pump assembly 68 in accordance with an embodiment of the present invention. Particularly, FIGS. 8 and 9 show an arrangement of magnets 78 attached to the circular plate 74 that is attached to the motor 72. As shown in FIG. 9, the magnets 78 are arranged such that poles of each of the magnets 78 attract opposing poles of nanomagnetic particles in ferrofluid 80. In such a manner, various magnetic fields are induced between the magnets 78 and ferrofluid 80, whereby the ferrofluid 80 moves in accordance with the movement of the magnets 78 (for example, in a clockwise direction as shown in FIG. 6). Those skilled in the art will note that such an arrangement facilitates a well-confined magnetic field as exemplarily shown in FIG. 10.

Figure 10:
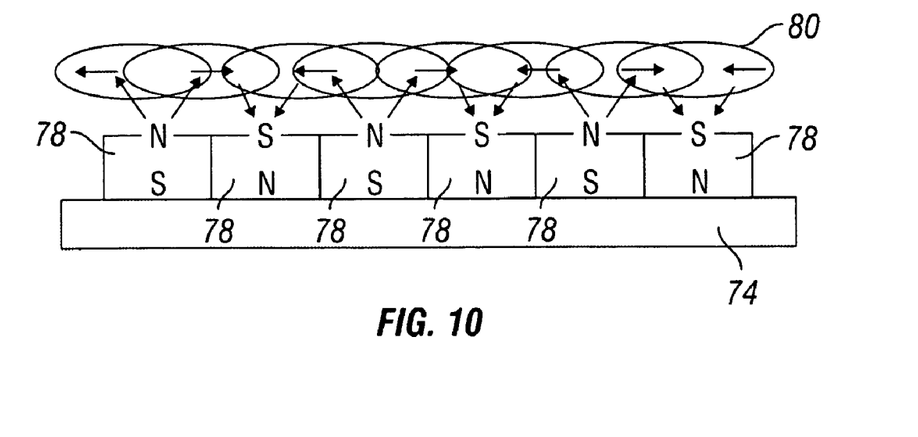
FIG. 10 shows a portion of a heat sink in accordance with an embodiment of the present invention.

In one or more other embodiments of the present invention, the number, shape, size, strength, and/or arrangement of magnets may differ from that shown in FIGS. 8-10.

Figure 11:
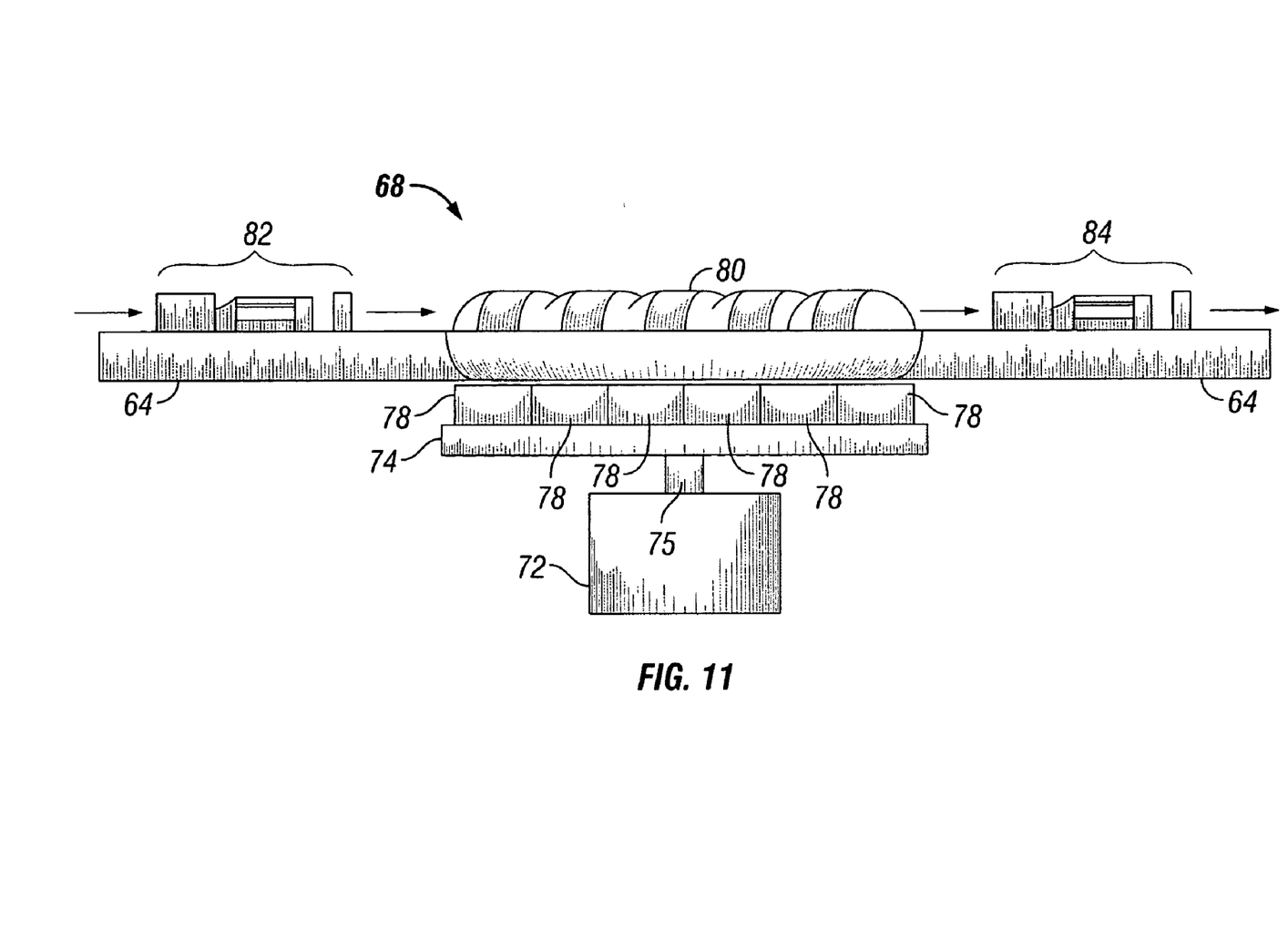
FIG. 11 shows a portion of a heat sink in accordance with an embodiment of the present invention.

As shown in FIG. 11, in an exemplary ferrofluid-based pump assembly 68 in accordance with an embodiment of the present invention, there is no contact between the magnets 78 and the pipe 64 traversing the ferrofluid-based pump assembly 68.

Advantages of the present invention may include one or more of the following. In one or more embodiments of the present invention, a relatively small motor may be used to rotate a relatively small amount of ferrofluid to drive nanofluid flow within a heat sink.

In one or more embodiments of the present invention, torque load on a motor used to effective drive nanofluid flow within a heat sink may be relatively small.

In one or more embodiments of the present invention, the motor rotation speed necessary to effectuate desired nanofluid flow within a heat sink may be relatively low, thereby resulting in low power consumption.

In one or more embodiments of the present invention, a ferrofluid-based pump assembly used to control nanofluid flow within a heat sink may be simple and/or compact in design.

In one or more embodiments of the present invention, a ferrofluid-based pump assembly is shielded so as to contain a magnetic field induced within the ferrofluid-based pump assembly.

In one or more embodiments of the present invention, magnets in a ferrofluid-based pump assembly are disposed in non-contact with a pipe arranged to carry nanofluid through the ferrofluid-based pump assembly, thereby preventing heat of the nanofluid and pipe from damaging the magnet and motor assembly of the ferrofluid-based pump assembly.

In one or more embodiments of the present invention, a ferrofluid-based pump assembly may be used to direct nanofluid heated by a heat source away from the heat source and to direct "cooled" nanofluid toward the heat source.

In one or more embodiments of the present invention, the rate of nanofluid flow within a heat sink may be adjusted by increasing or decreasing the rotation speed of a motor used to rotate magnetic fields in a ferrofluid-based pump assembly.

In one or more embodiments of the present invention, a motor of a ferrofluid-based pump assembly used to circulate nanofluid in a heat sink may be easily repaired or replaced.

In one or more embodiments of the present invention, a ferrofluid-based pump assembly drives nanofluid flow within a heat sink with relatively now noise.

In one or more embodiments of the present invention, the arrangement of magnets in a ferrofluid-based pump assembly used to drive nanofluid flow within a heat sink may facilitate a well-confined magnetic field, thereby resulting in no or very low magnetic field leakage.

In one or more embodiments of the present invention, there may be little or no friction between nanofluid flowing in a ferrofluid-based pump assembly used to drive nanofluid flow within a heat sink and a motor assembly used to drive the ferrofluid-based pump assembly.

In one or more embodiments of the present invention, nanofluid flow within a heat sink may be easily reversed by, for example, changing a direction of motor rotation in a ferrofluid-based pump assembly used to drive nanofluid flow within the heat sink.

In one or more embodiments of the present invention, a heat sink uses thermally conductive nanofluid with thermally conductive nanoparticles for conducting heat dissipated by an integrated circuit.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system, comprising:
   an integrated circuit; and
   a heat sink operatively connected to the integrated circuit, the heat sink comprising:
   a pipe arranged to carry nanofluid within the heat sink, and
   a pump assembly having ferrofluid and operatively connected to the pipe, comprising:
   a motor having a shaft operatively connected to a metal plate; and
   at least one magnet attached to the metal plate,
   wherein at least one magnetic field is induced between the at least one magnet and the ferrofluid,
   wherein a direction of flow of the nanofluid in the heat sink is dependent on the ferrofluid.

2. The computer system of claim 1, wherein the nanofluid is thermally conductive.

3. The computer system of claim 1, wherein the nanofluid comprises copper nanoparticles.

4. The computer system of claim 1, the heat sink further comprising:
   a heat spreader operatively connected to the pipe and arranged to allow for air flow through the heat spreader.

5. The computer system of claim 1, wherein the motor is arranged to rotate the at least one magnet.

6. The computer system of claim 1, wherein the at least one magnet is not in contact with the pipe.

7. The computer system of claim 1, the pump assembly further comprising:
   at least one metal piece arranged to shield a magnetic field induced between the at least one magnet and the ferrofluid.

8. The computer system of claim 1, wherein at least one of the pump assembly and the motor is circular in shape.

9. The computer system of claim 1, the heat sink further comprising:
   a valve disposed within the pipe to ensure nanofluid flow in a single direction.

10. A method of cooling an integrated circuit with a heat sink, comprising:
    rotating ferrofluid within a pump assembly of the heat sink, wherein the pump assembly comprises:
    a motor having a shaft operatively connected to a metal plate; and
    at least one magnet attached to the metal plate,
    wherein at least one magnetic field is induced between the at least one magnet and the ferrofluid;
    propagating thermally conductive nanofluid toward the integrated circuit in a direction dependent on the rotating; and
    propagating the nanofluid away from the integrated circuit in a direction dependent on the rotating.

11. The method of claim 10, further comprising:
    rotating the at least one magnet using the motor, wherein rotating the ferrofluid is dependent on rotating the at least one magnet.

12. The method of claim 11, further comprising:
    at least partially shielding a magnetic field induced between the at least one magnet and the ferrofluid.

13. The method of claim 10, further comprising:
    passing air through a portion of the heat sink to cool the nanofluid.

14. A heat sink, comprising:
a heat spreader through which air is arranged to flow;
a copper pipe operatively connected to the heat spreader and arranged to carry thermally conductive nanofluid in the heat sink; and
a motorized pump assembly, comprising:
  a motor having a shaft operatively connected to a metal plate; and
  at least one magnet attached to the metal plate,
  wherein at least one magnetic field is induced between the at least one magnet and the ferrofluid,
wherein the motorized pump assembly is arranged to rotate ferrofluid contained in the motorized pump assembly, and
wherein a direction of nanofluid flow in the heat sink is dependent on the rotation of the ferrofluid.

15. The heat sink of claim 14, wherein the thermally conductive nanofluid comprises copper nanoparticles.

16. The heat sink of claim 14, wherein the copper pipe is operatively connected to the motorized pump assembly, and wherein the at least one magnet is not physically in contact with the copper pipe.

17. The heat sink of claim 14, wherein at least one of the motorized pump assembly, the motor, and the metal plate is circular in shape.

18. The heat sink of claim 14, further comprising:
a check valve embedded in the copper pipe and arranged to ensure nanofluid flow in a single direction.

* * * * *